United States Patent
Russ

(10) Patent No.: US 7,982,523 B2
(45) Date of Patent: Jul. 19, 2011

(54) ELECTRO STATIC DISCHARGE CLAMPING DEVICE

(75) Inventor: Cornelius Christian Russ, Diedorf (DE)

(73) Assignee: Infineon Technologies AG, Neubiberg (DE)

( * ) Notice: Subject to any disclaimer, the term of this patent is extended or adjusted under 35 U.S.C. 154(b) by 214 days.

(21) Appl. No.: 12/329,415

(22) Filed: Dec. 5, 2008

(65) Prior Publication Data

US 2010/0140712 A1    Jun. 10, 2010

(51) Int. Cl.
*H03L 5/00* (2006.01)
*H03K 5/08* (2006.01)

(52) U.S. Cl. ............... 327/313; 360/323; 361/56
(58) Field of Classification Search ............... 327/313; 360/323; 361/56; 257/355

See application file for complete search history.

(56) References Cited

U.S. PATENT DOCUMENTS

| | | | |
|---|---|---|---|
| 4,855,620 A | 8/1989 | Duvvury et al. | |
| 5,191,244 A | 3/1993 | Runaldue et al. | |
| 5,502,317 A | 3/1996 | Duvvury | |
| 6,249,410 B1 | 6/2001 | Ker et al. | |
| 7,289,307 B2 * | 10/2007 | Ker et al. | 361/56 |
| 7,403,362 B2 * | 7/2008 | Lee et al. | 361/56 |
| 2009/0040668 A1 * | 2/2009 | Chen et al. | 361/56 |

* cited by examiner

*Primary Examiner* — Lincoln Donovan
*Assistant Examiner* — John W Poos
(74) *Attorney, Agent, or Firm* — Slater & Matsil, L.L.P.

(57) ABSTRACT

Electrostatic discharge clamp devices are described. In one embodiment, the semiconductor device includes a first transistor, the first transistor including a first source/drain and a second source/drain, the first source/drain coupled to a first potential node, the second source/drain coupled to a second potential node. The device further includes a OR logic block, a first input of the OR logic block coupled to the first potential node through a capacitor, the first input of the OR logic block being coupled to the second potential node through a resistor, and a second input of the OR logic block coupled to a substrate pickup node of the first transistor.

34 Claims, 16 Drawing Sheets

ELECTRO STATIC DISCHARGE CLAMPING DEVICE

TECHNICAL FIELD

The present invention relates generally to electro static discharge, and more particularly to a semiconductor device for protecting against electro static discharge.

BACKGROUND

As electronic components are getting smaller along with the internal structures in integrated circuits, it is increasingly easier to either completely destroy or otherwise impair electronic components. In particular, many integrated circuits are highly susceptible to damage from the discharge of static electricity. Generally, electrostatic discharge (ESD) is the transfer of an electrostatic charge between bodies at different electrostatic potentials or voltages, caused by direct contact or induced by an electrostatic field. The discharge of static electricity, or ESD, has become a critical problem for the electronics industry.

Device failures resulting from ESD events are not always immediately catastrophic or apparent. Often, the device is only slightly weakened but is less able to withstand normal operating stresses. Such a weakened device may result in reliability problems. Therefore, various ESD protection circuits should be included in an integrated circuit to protect its various components.

When a transistor is impacted by an ESD pulse, the extremely high voltage of the ESD pulse can break down the transistor and can potentially cause permanent damage. Consequently, the transistors of an integrated circuit need to be protected from ESD pulses to prevent such damage.

Integrated circuits and the geometry of the transistors that make up the integrated circuits continue to be reduced in size and the transistors are arranged closer together. A transistor's physical size limits the voltage that the transistor can withstand without being damaged. Thus, breakdown voltages of transistors are lowered and currents capable of overheating components are more frequently reached by the voltages and currents induced by an ESD event.

Thus, there is a need for small ESD protection devices that can be rapidly triggered and conduct through the duration of the pulse, yet are robust against spurious effects such as false triggering.

SUMMARY OF THE INVENTION

These and other problems are generally solved or circumvented, and technical advantages are generally achieved, by preferred embodiments of the present invention.

Embodiments of the invention include electrostatic discharge clamps. In accordance with a preferred embodiment of the present invention, a semiconductor device includes a first transistor, the first transistor comprising a first source/drain and a second source/drain, the first source/drain coupled to a first potential node, the second source/drain coupled to a second potential node. The device further comprises an OR logic block, a first input of the OR logic block coupled to the first potential node through a capacitor, the first input of the OR logic block being coupled to the second potential node through a resistor, and a second input of the OR logic block coupled to a substrate pickup node of the first transistor.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes

FIG. 2, which includes FIGS. 2a and 2b, illustrates an electro static discharge clamp device, in accordance with an embodiment of the invention, wherein FIG. 2a illustrates the circuit and FIG. 2b illustrates the operation of the MOS transistor of the ESD clamp;

FIG. 3, which includes

FIG. 10, which includes FIGS. 10a-10c, illustrates the layout of the MOS transistor of the electro static discharge clamp devices, in accordance with an embodiment of the invention, wherein FIG. 10a illustrates a top view and FIGS. 10b and 10c illustrate alternate embodiments of cross sectional view.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an electro static discharge clamp. The invention may also be applied, however, to other types of applications and devices.

Figure 1A:
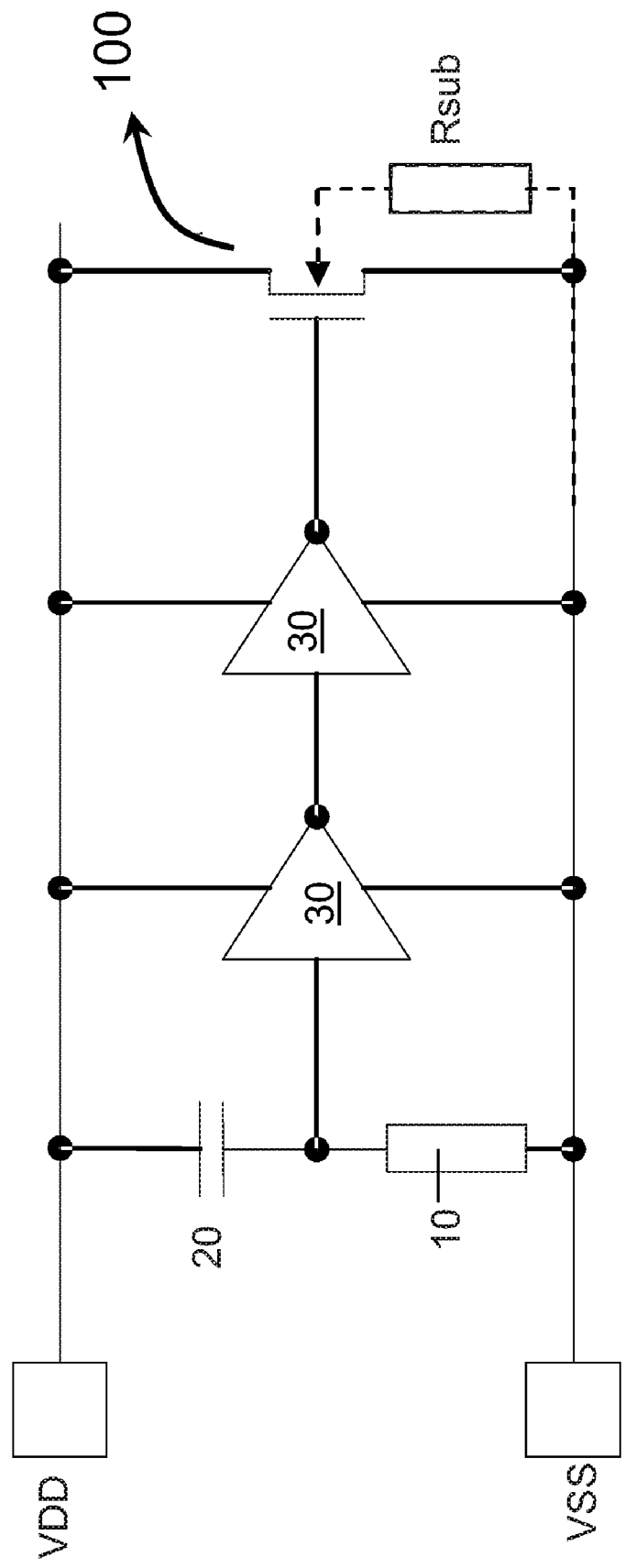
FIGS. 1a-1c, illustrates prior art electro static discharge clamp devices.

Gate-biased electro static discharge (ESD) power supply clamps are used in the art for protection against ESD. Gate-biasing is generated typically from the output voltage of an RC-timer circuit which is amplified by one or more buffer stages. A standard RC-timed MOS power supply clamp ("RCMOS") is shown in FIG. 1a. The clamp is triggered with the rising edge of the ESD pulse and remains conducting as determined by the RC-time constant. The RC time constant is determined by the resistance of the resistor 10 and the capacitance of the capacitor 20. The buffers 30 amplify the voltage at a node between the capacitor 20 and the resistor 10 to transiently bias the gate of the MOS transistor 100. However, after the transient (a time given by the time constant of the RC timer), the MOS transistor 100 of the RCMOS clamp is not conducting any more as the gate bias drops after the charging of the capacitor 20 because the node voltage drops close to ground. Hence, if the time constant of the RC timer circuit is less than that of the ESD event, the RCMOS clamp cannot provide a conductive path during the full duration of the ESD event. As the pulse width of the ESD event and the time constant of the RC circuit are independent, the RC-time constant needs to be large enough to cover the duration of an ESD pulse. Further, the RC timer circuit has to be designed to accommodate the worst case scenario (largest pulse expected). Hence, in practice, the RCMOS clamp requires large area capacitors, and results in a deleterious increase in stand-by leakage current.

Figure 1B:
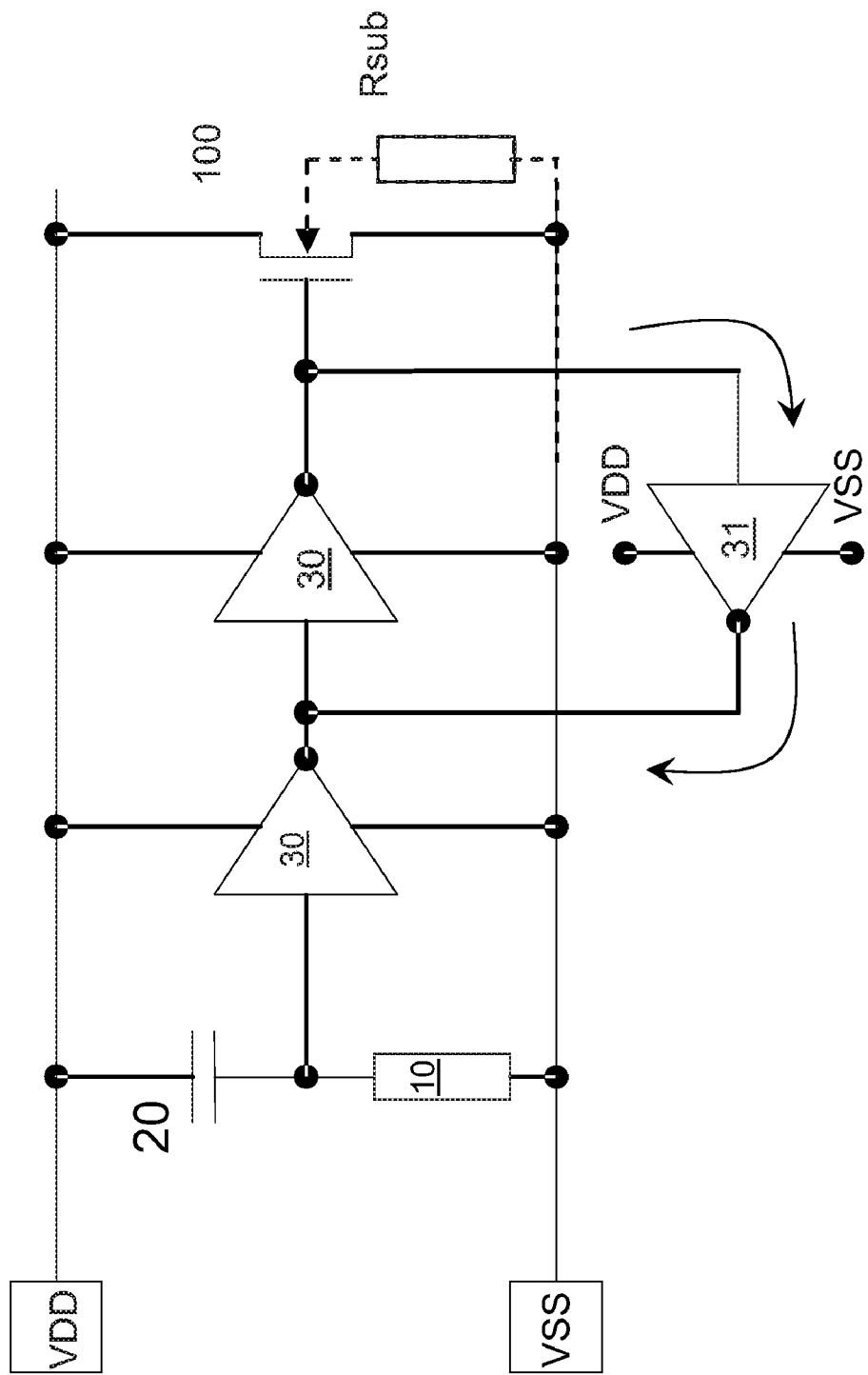
Figure 1C:
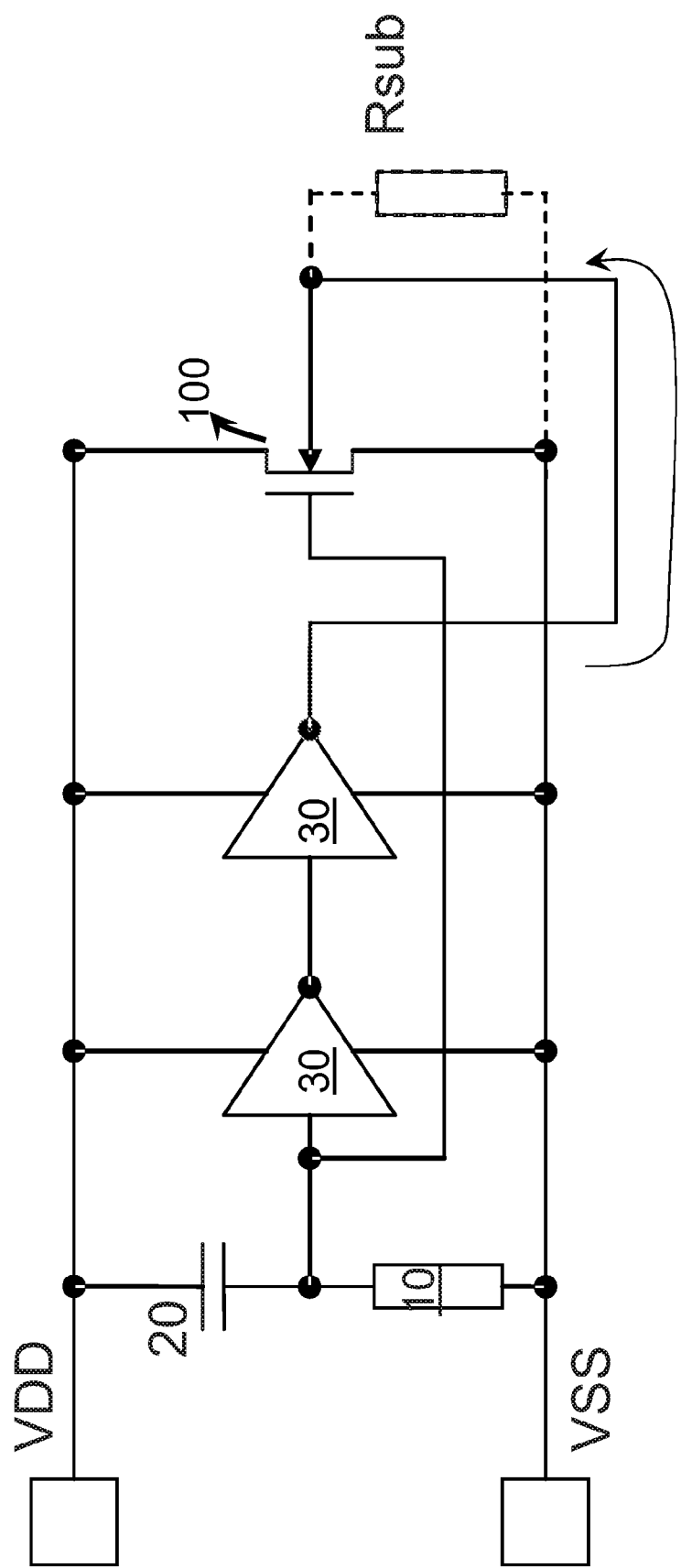

To overcome the limitation of requiring large RC timer circuits, feed back circuits are added to the RCMOS clamps. For example, as illustrated in FIG. 1b, additional, feedback loops are used to enhance the gate-bias effect and to increase the effective RC-time constant without requiring more (IC-area consuming) capacitance. In FIG. 1b, an additional buffer 31 forms a feedback loop that sustains a longer transient at the gate of the MOS transistor 100. Thus, the gate bias signal at the MOS transistor 100 is sustained for a longer time than the original RC-time constant of the RC circuit. However, RC-timed MOS power supply clamps exhibit many problems including unintended triggering and/or increased leakage currents during e.g. power ramp up or noise/voltage spikes on the supply line. Particularly, RCMOS with feedback loops have to be very carefully designed to avoid oscillation. Furthermore, all RC-timed MOS clamps are specifically sensitive to trailing electrical overstress (EOS), an unwanted phenomenon occurring in some ESD testing equipment, where parts of the remaining charge cannot be drained away due to the shut-off of the clamp after RC-time-out.

Another approach in the art is the use of substrate pumping. The substrate-pumped clamp, as illustrated in FIG. 2, features a pump transistor that pumps current into the local substrate of the actual ESD shunt element (e.g. by a ring). The substrate pumping allows the MOS transistor 100 to uniformly conduct by a combination of MOS source to drain current arising from the extra gate biasing, enhanced MOS current due to the increased substrate potential and thus utilization of the MOS-body effect, and finally bipolar current due to the injected substrate current acting as base current for the parasitic bipolar. Yet, as in the case of the RCMOS device discussed above, a RC-timer circuit is required to turn on the clamp (MOS transistor 100) for the complete duration of the ESD pulse. Another drawback is the large size required for the pump transistor (within the buffers 30), which may typically reach the size of the clamp device itself.

Because of mainly MOS-based device operation, both clamping approaches described above can be used without the need for silicide blocking. Silicide blocking is a process feature formed by blocking the formation of the silicide over the source/drain regions. The absence of silicide adds ballasting resistance in the source/drain regions. Silicide blocking would prevent failure of the device due to local heating arising from non-uniform current distribution. With silicide blocking, the current would be forced through a larger region resulting in better heat dissipation. Silicide blocking is not needed in the prior art devices mentioned and is generally not preferred as it requires a separate masking step resulting in an increase in production cost.

In various embodiments, the present invention overcomes these limitations by providing an ESD clamp whose conduction is determined by the ESD event (rather than an independent RC timer), that is robust against false triggering during power up, and/or against supply noise, and immune from trailing EOS. Further, the present invention in various embodiments comprises a device that is fabricated in a small area due to the low capacitive requirements, and consumes lower power (low leakage).

Embodiments of the invention use RC-triggering for generating a bias voltage only for the initial turn of the ESD clamp comprising a MOS transistor. After the MOS transistor of the ESD clamp is turned on, the bias voltage for the remainder of the ESD pulse will be generated by the clamp itself. Further, the ESD clamp is "self-timed" to match the duration of the ESD pulse. In various embodiments, the clamping device is a MOS transistor that operates at the transition between MOS-mode and bipolar-mode. This inter mode operation of the MOS transistor results in an elevated substrate potential. The elevated substrate potential is fed back to a circuit from which the bias voltage is generated. However, the elevated substrate potential is only existent for the duration of the ESD pulse resulting in an "auto-biased" device. Embodiments of the present invention disclosure include circuit implementations and additional device design and layout techniques for realizing this clamping technique for ESD protection.

In contrast to the above mentioned prior art, the auto-biased self-timing (ABST) clamp does not inject a substrate current by a pumping circuit, but picks up an inherent substrate potential. Unlike the embodiment of FIG. 1b, a circular feedback mechanism of the gate voltage is not used. Rather, a moderate avalanche breakdown at the onset of parasitic bipolar conduction makes the clamp advantageously immune to false triggering during normal circuit operating conditions. Embodiments of the invention include omitting use of silicide blocking for the MOS clamp transistor, thus saving area and processing costs.

An embodiment of the invention will be described using FIG. 2. Simulations illustrating the operation of the ESD will be described using FIG. 3. Further embodiments of the ESD clamp will be described using FIGS. 4-9. Structural embodiment of the MOS transistor in the ESD clamp will be described using FIGS. 10 and 11.

Figure 2A:
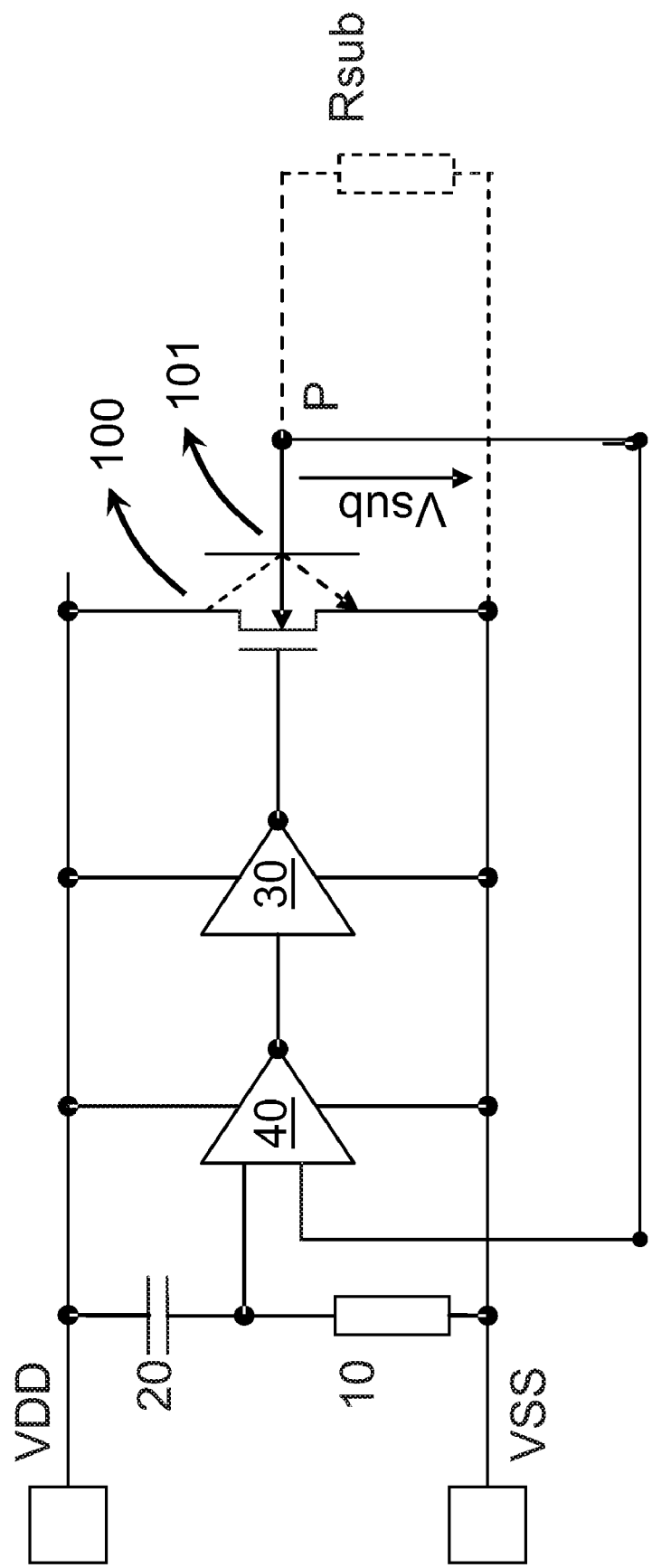
Figure 2B:
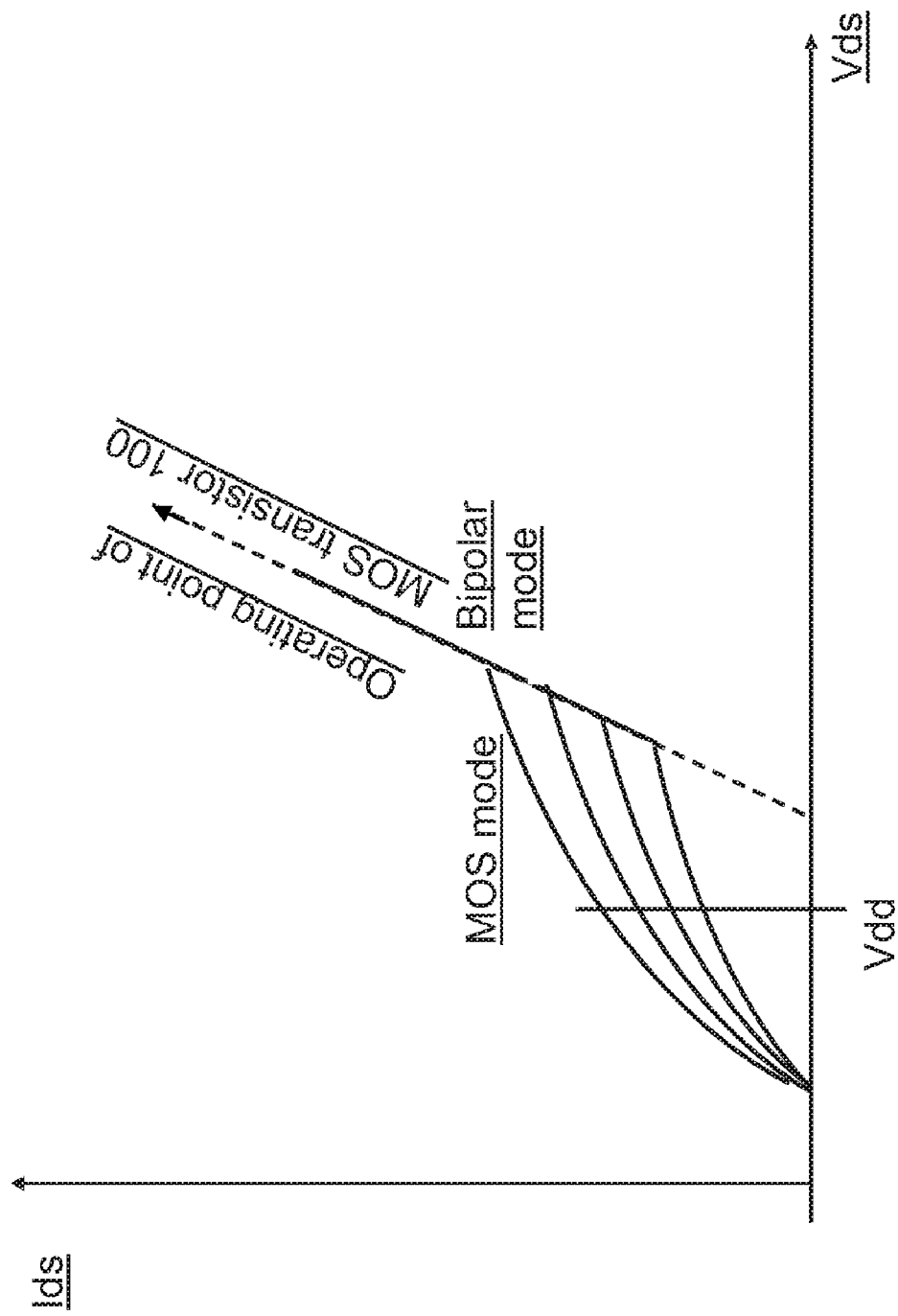

FIG. 2, which includes FIGS. 2a and 2b, illustrates the ESD clamp device in accordance with an embodiment of the invention.

FIG. 2a illustrates an ESD clamp device in accordance with an embodiment of the invention. The ESD clamp device comprises a MOS transistor 100 coupled between power supply line VDD, and substrate voltage line VSS. A parasitic bipolar device 101 is also illustrated. The gate of the MOS transistor 100 is coupled to a RC timer circuit through an inverting buffer stage 30 (or a plurality of inverting buffer stages) and a NOR gate 40. In particular, a first plate of the capacitor 20 is coupled to the power supply line VDD and a second plate of the capacitor 20 is coupled to the substrate voltage line VSS through the resistor 10. The first input of the NOR gate 40 is coupled to the second plate of the capacitor 20, while a second input of the NOR gate 40 is coupled to the substrate of the MOS transistor 100. However, unlike prior embodiments, the substrate of the MOS transistor 100 is coupled to the second input of the NOR gate 40 through a pickup node P. The coupling of the substrate of the MOS transistor 100 to the second input of the NOR gate 40 forms the auto biasing circuit.

The MOS transistor 100, in various embodiments, comprises a large width. In one embodiment, the gate length of the MOS transistor 100 may be at a minimum possible length, and, for example, about 50 nm in one embodiment. The width of the MOS transistor 100 is at least 10 µm, and about 200 µm to about 400 µm in one embodiment. The local substrate of the MOS transistor 100 is coupled to the substrate voltage line VSS through a substrate resistance (Rsub) depending on the design of the MOS transistor 100. In one embodiment, the local substrate is shielded from the substrate contact by counter doped regions. For optimal pickup of the local substrate potential, the substrate resistance Rsub is larger than the pickup resistance between the junction of the MOS transistor 100 (e.g., the source/substrate junction) generating the carriers and the pickup node P of the MOS transistor 100. Hence, the pickup point P for picking the local substrate potential is closer to the junction of the MOS transistor 100 than the substrate pickup point for contacting the substrate or body of the MOS transistor 100. Further, the pickup resistance is reduced as much as possible.

The operation of the ESD clamp device will be described using FIG. 2b. The drain-to-source current (Ids) versus drain-to-source voltage (Vds) response of the MOS transistor (in linear scale) is illustrated in FIG. 2b. At low voltages the MOS transistor behaves like a conventional MOS transistor. Hence, when the gate bias is turned on due to the initial transient of the RC circuit, a drain-to-source current flows. Hence, the NOR gate 40 outputs a low signal to the inverting buffer stage(s) 30 if the capacitor 20 is charging in response to an ESD pulse. The inverting buffer stage(s) 30 outputs an amplified high signal on the gate of the MOS transistor 100 forming a conductive path between power supply line (Vdd), and substrate voltage line (Vss).

After this initial transient response of the ABST clamp which is determined by the RC timer circuit, the high electric field across the drain and the substrate junction breaks down the junction due to avalanche breakdown. Consequently, this pulls up the local substrate potential of the MOS transistor 100. As the substrate node of the MOS transistor 100 is coupled to the second input of the NOR gate 40, this results in a transfer of the local substrate potential to the second input of the NOR gate 40. Again as the NOR gate 40 outputs a low signal to the inverting buffer stage(s) 30, and the inverting buffer stage(s) 30 outputs an amplified high signal on the gate of the MOS transistor 100. Thus, the substrate potential is amplified into a gate bias of the MOS transistor 100. The high gate bias preserves the inversion region of the MOS transistor 100 and maintains the conductive path between power supply line (Vdd), and substrate voltage line (Vss). The conduction through the drain/substrate junction due to moderate avalanche breakdown stops when the drain voltage drops after the duration of the ESD pulse. Hence, the substrate voltage drops to a lower value closer to the substrate voltage line (Vss). As the substrate is coupled to the NOR gate 40 through the pickup node P, the gate bias on the MOS transistor 100 drops and the MOS transistor 100 stops conducting.

Thus, the auto-biased self-timed ESD clamp uses RC-triggering only for providing a bias signal for initial turn like an RCMOS. The gate bias voltage for the main portion of the ESD pulse is generated by the clamp itself. After RC-time out, the clamping device is operated at the transition between MOS-mode and bipolar-mode which results in an elevated substrate potential. The clamp remains in conducting mode in a self-sustaining way through the duration of the ESD pulse, after which the clamp turns off.

In contrast to prior art, the ABST clamp does not pump the substrate and does not feed back its own gate bias. Rather, the ABST clamp generates its own gate biasing by feeding back its own substrate potential. As the device is operated by moderate avalanche breakdown and at moderately higher clamping voltages at the transition region from MOS conduction to parasitic bipolar conduction, the ABST clamp is immune to false triggering during normal circuit operating conditions, which are substantially lower than supply voltage Vdd. In various embodiments, silicided source/drain regions are formed on the MOS transistor 100 without the need for blocking the formation of silicide regions. This saves an extra mask step along with the related processing saving area and processing costs.

Figure 3A:
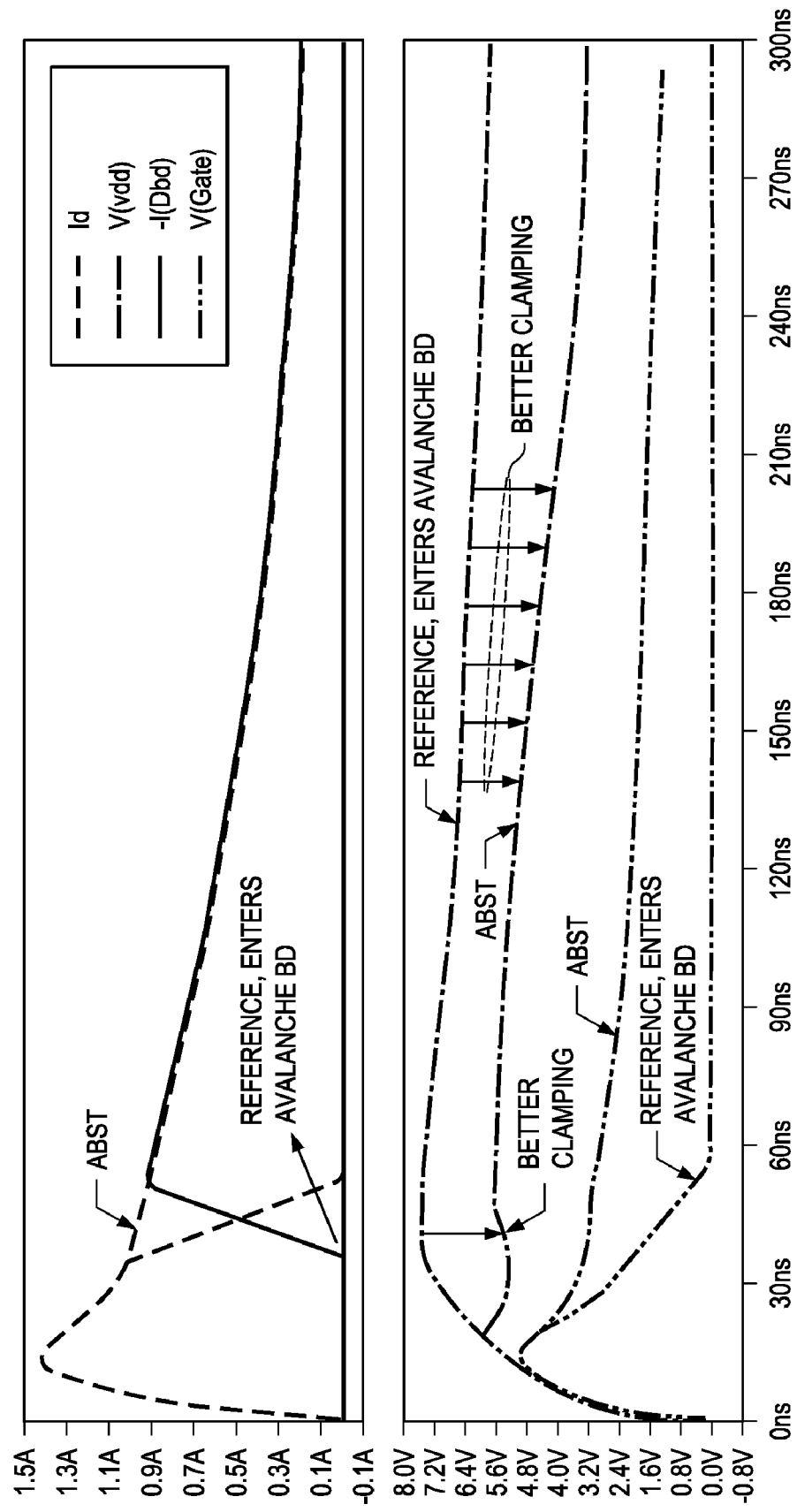
FIGS. 3a and 3b, illustrates operation of electro static discharge clamp devices, in accordance with an embodiment of the invention.
Figure 3B:
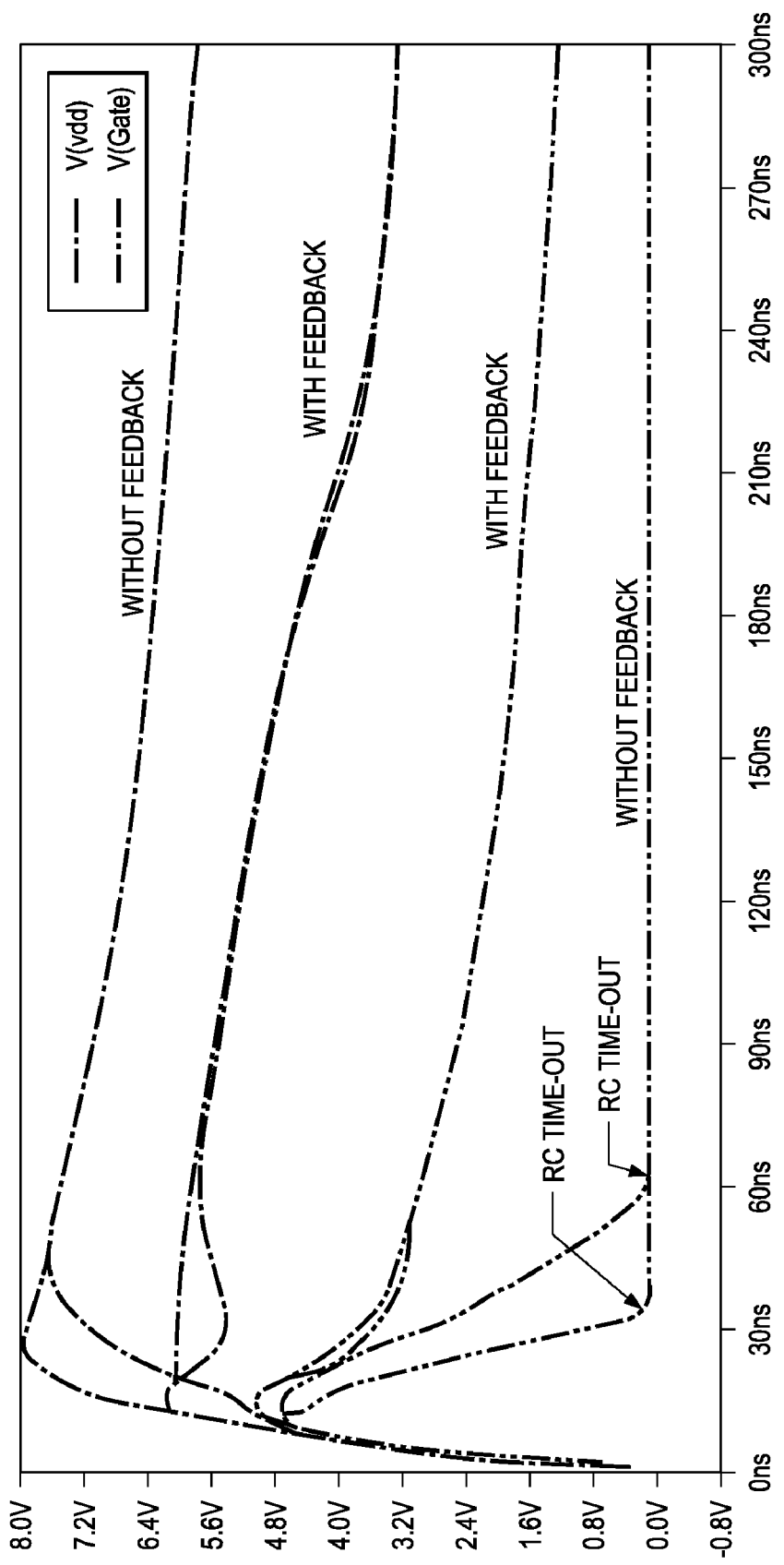

FIG. 3, which includes FIGS. 3a and 3b, illustrates the detailed operation of an auto biased self timing ESD clamp, in accordance with embodiments of the invention.

Circuit simulations of a 2 kV human body model (HBM) ESD discharge illustrate the operation and advantage of the Auto-Biased Self-Timed (ABST) MOS Clamp, in accordance to embodiments of the invention. In FIGS. 3a and 3b, the ABST clamp is compared against a RCMOS clamp as described in FIG. 1a.

The ABST clamp demonstrates an improved gate bias voltage V(Gate) over the RCMOS clamp during the entire duration of the ESD pulse and results in a better clamping as seen by the reduced drain voltage (vdd). The simulation is performed using a RC timer circuit with a time constant of 20 ns which is much smaller than the time constant of a human body model (HBM) ESD pulse, which is typically about 150 ns. For the simulation illustrated in FIG. 3, the gate length of the MOS transistor 100 is about 230 nm, and the width is about 1000 µm.

The drawback of the reference design is clearly visible in FIG. 3a. As illustrated in FIG. 3a, after the time constant of the RC timer circuit, the gate voltage V(Gate) of the MOS transistor 100 drops. The increasing drain voltage V(vdd) results in the break down of the drain-substrate junction due to a hard avalanche breakdown resulting in a breakdown current I(Ddb). In contrast, the ABST clamp device shows a much smaller drop in gate voltage V(Gate) resulting in continued flow of source/drain current (Id). Hence, an effective clamping of the drain voltage is achieved.

FIG. 3b illustrates the robustness of the ABST design by comparing the reference RCMOS clamp and the ABST clamp using two different RC timer circuits. The time constant of the first RC timer circuit is about 10 ns, whereas the time constant of the second RC timer circuit is about 20 ns. This is visible in the curves illustrating the gate voltage of the RCMOS clamp (labeled "RC time out"). The actual duration of the gate voltage is about 35 ns and 55 ns for the first and the second RC timer circuits respectively for reference RCMOS. The gate voltage of the ABST clamp is much higher, and almost indistinguishable for both time constants. Hence, as expected, the drain voltage clamping is also similar for the ABST clamps using the different RC timer circuits. Unlike the RCMOS clamps, the voltage clamping of the ABST clamp is independent of the RC time constant of the RC circuits illustrating the robust applicability and proof of the concept of auto biasing in accordance with an embodiment of the invention.

Figure 4:
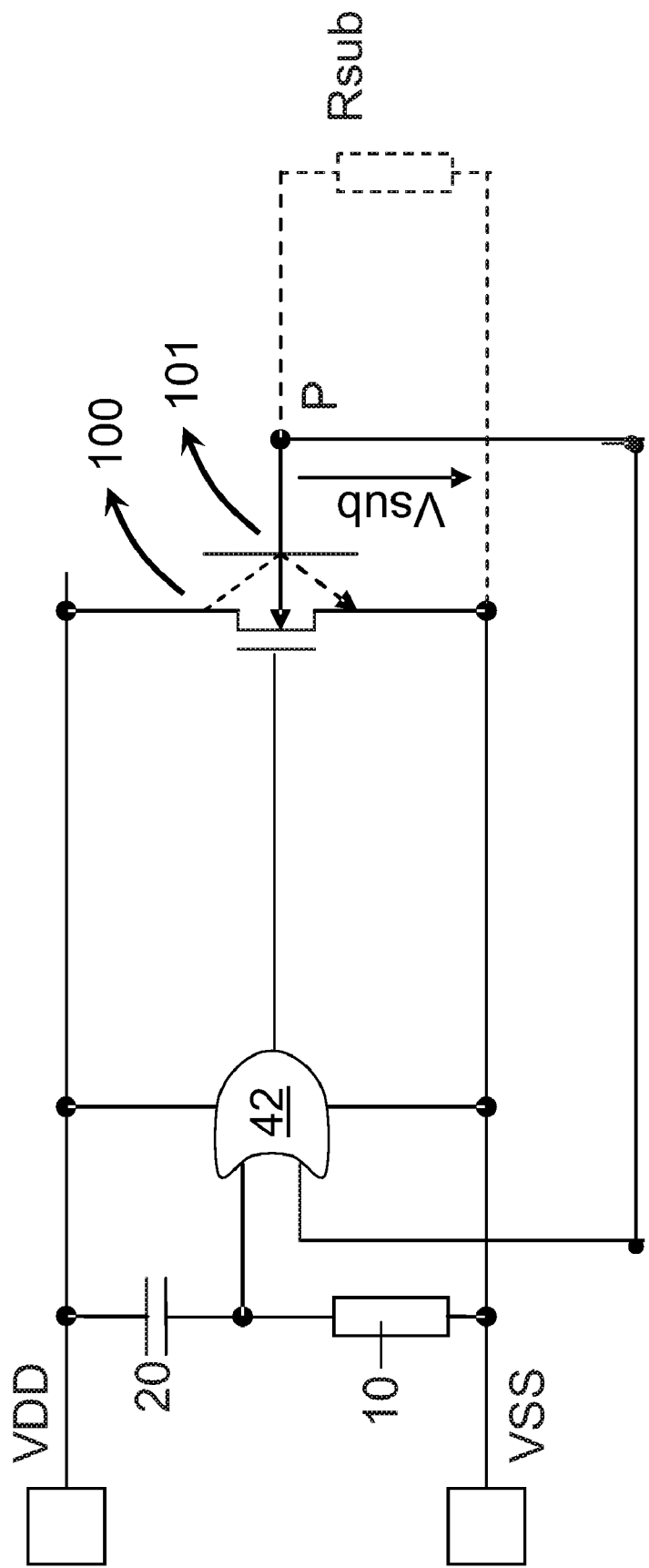
FIG. 4 illustrates an electro static discharge clamp device, in accordance with an embodiment of the invention.

FIG. 4 illustrates an embodiment of the ESD clamp device in accordance with an embodiment of the invention. In this embodiment, the NOR gate 40 and the inverting buffers 30 are replaced by an OR gate 42. Hence, the operation of this device is similar to that described above.

Figure 5:
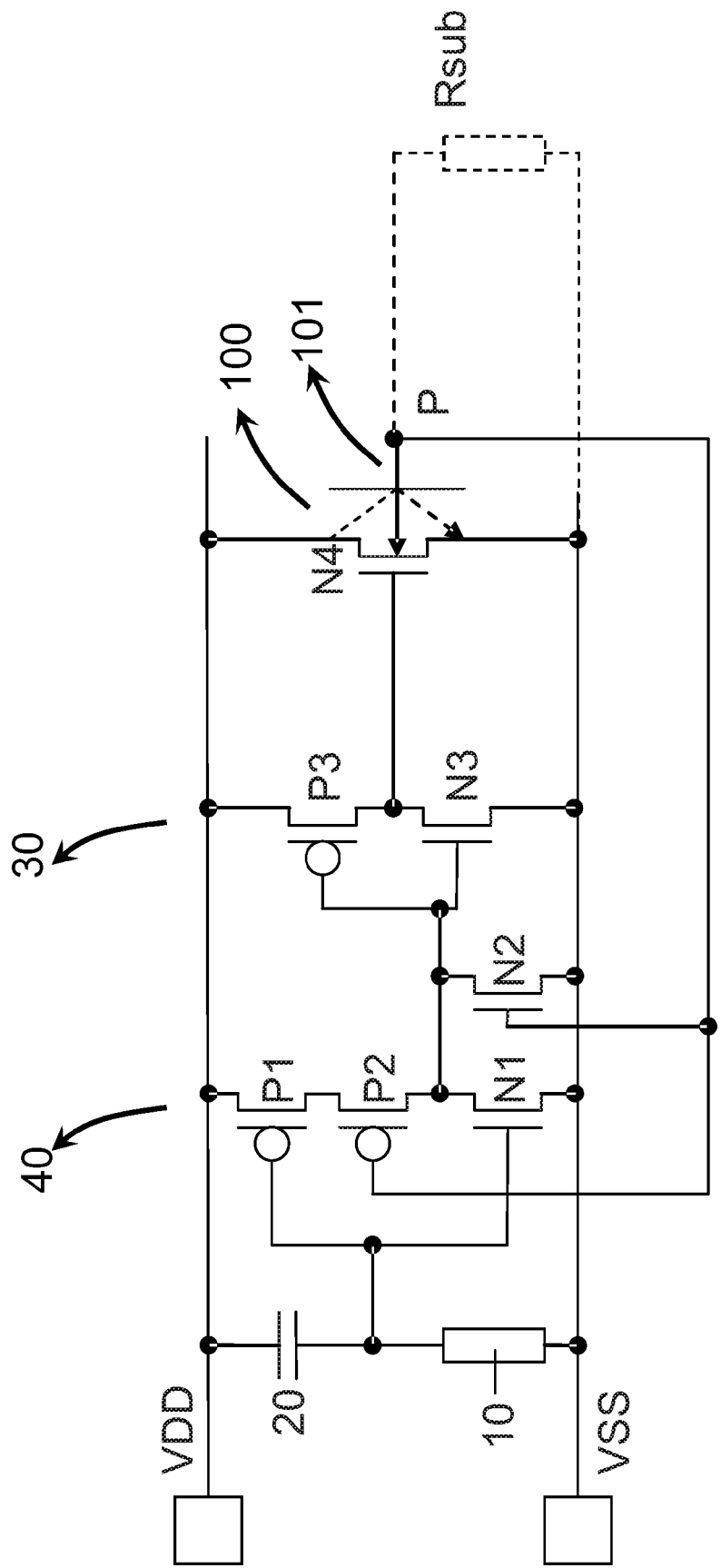
FIG. 5 illustrates an electro static discharge clamp device, in accordance with an embodiment of the invention.

FIG. 5 illustrates an embodiment of a circuit implementation of the invention using ABST techniques discussed in FIG. 2. The ABST clamp comprises a NOR gate 40 comprising a first NMOS transistor N1, a second NMOS transistor N2, a first PMOS transistor P1, and a second PMOS transistor P2. A third PMOS transistor P3 and a third NMOS transistor N3 form an inverting buffer stage. The RC timer circuit comprises a capacitor 20 and a resistor 10, the RC timer coupled to the NOR gate 40 and the power supply lines as described above with respect to FIG. 2. The MOS transistor 100 comprises a fourth NMOS transistor N4. The fourth NMOS transistor N4, in various embodiments, comprises a large width transistor. In various embodiments, the gate length of the fourth NMOS transistor N4 is a minimum length transistor. In one embodiment, the gate length of the fourth NMOS transistor N4 is about 50 nm to about 100 nm. The width of the fourth NMOS transistor N4 is at least 10 μm in one embodiment.

Figure 6:
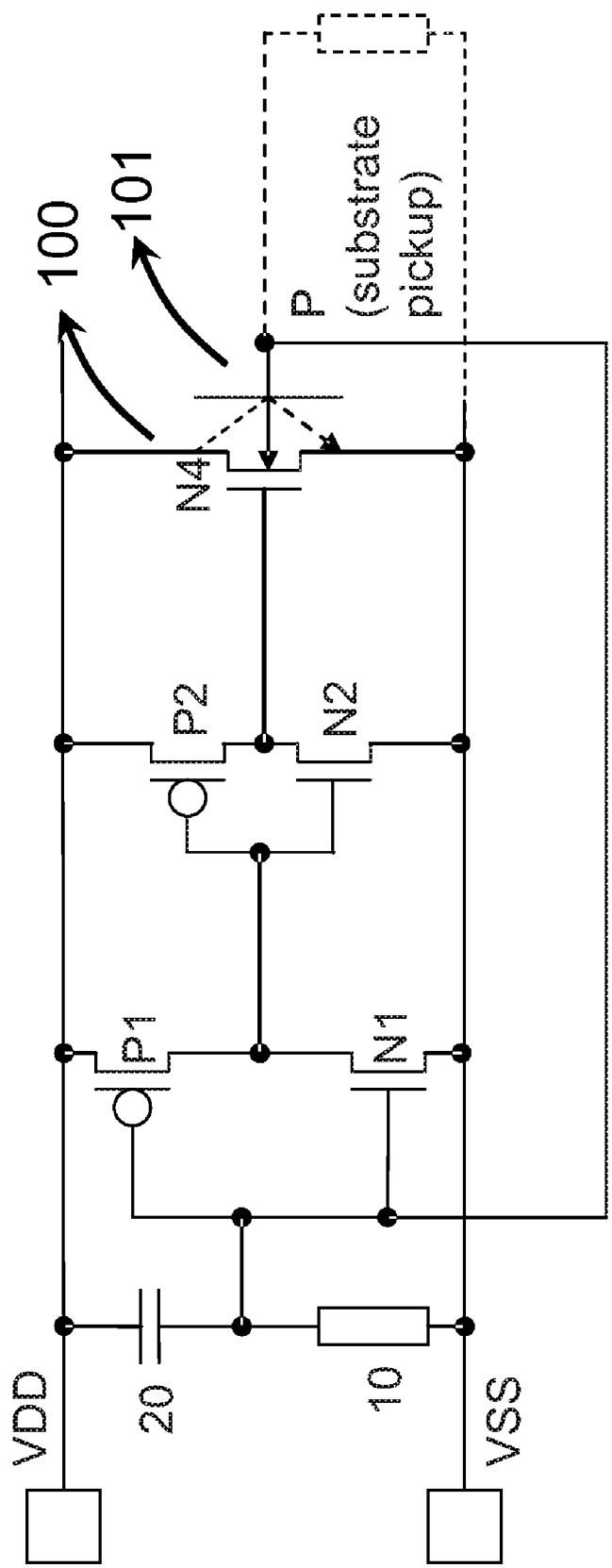
FIG. 6 illustrates an electro static discharge clamp device, in accordance with an embodiment of the invention.

FIG. 6 illustrates a simplified embodiment of a circuit implementation of the invention using ABST techniques discussed in FIG. 2.

Unlike the embodiment of FIG. 2a, in this embodiment, the NOR gate of FIG. 2a is replaced by an inverting buffer stage. Hence, the circuit comprises a first inverting buffer stage comprising a first PMOS transistor P1 and a first NMOS transistor N1, and a second inverting buffer stage comprising a second PMOS transistor P2 and a second NMOS transistor N2 (MOS transistor 100). In this embodiment, some of the initial trigger signal of the RC circuit is also used for generating a substrate bias. After timeout of the RC circuit, the circuit draws a signal from the local substrate pickup and generates the gate bias for the MOS transistor 100.

Figure 7:
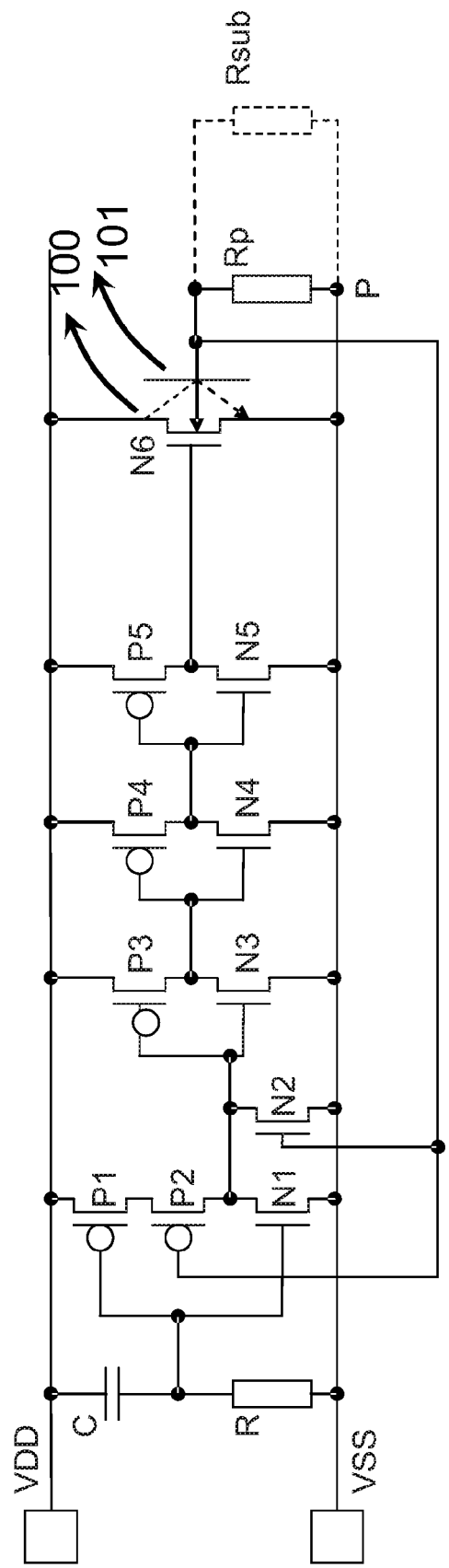
FIG. 7 illustrates an electro static discharge clamp devices, in accordance with an embodiment of the invention.

FIG. 7 illustrates an embodiment of a circuit implementation of the invention using ABST techniques discussed in FIG. 2. This embodiment is similar to that shown in FIG. 5, but includes additional inverting buffer stages.

As described with respect to FIG. 5, the NOR gate comprises a first NMOS transistor N1, a second NMOS transistor N2, a first PMOS transistor P1, and a second PMOS transistor P2. A first inverting stage comprising a third PMOS transistor P3 and a third NMOS transistor N3 is coupled to the NOR gate.

Unlike FIG. 5, two additional inverting buffer stages are coupled to the gate of the MOS transistor 100. Hence, the gate bias on the MOS transistor 100 is amplified more than the embodiment of the FIG. 5. A second inverting stage comprising a fourth PMOS transistor P4 and a fourth NMOS transistor N4 is coupled to the first inverting stage. A third inverting stage comprising a fifth PMOS transistor P5 and a fifth NMOS transistor N5 is coupled to the second inverting stage. The third inverting stage is coupled to the MOS transistor 100. Although in this embodiment two additional inverting buffer stages are added, in other embodiments, more number of inverting buffer stages may be added. In various embodiments, the inverting buffer stages are added in increments of two till the required gate signal amplification is achieved.

Figure 8:
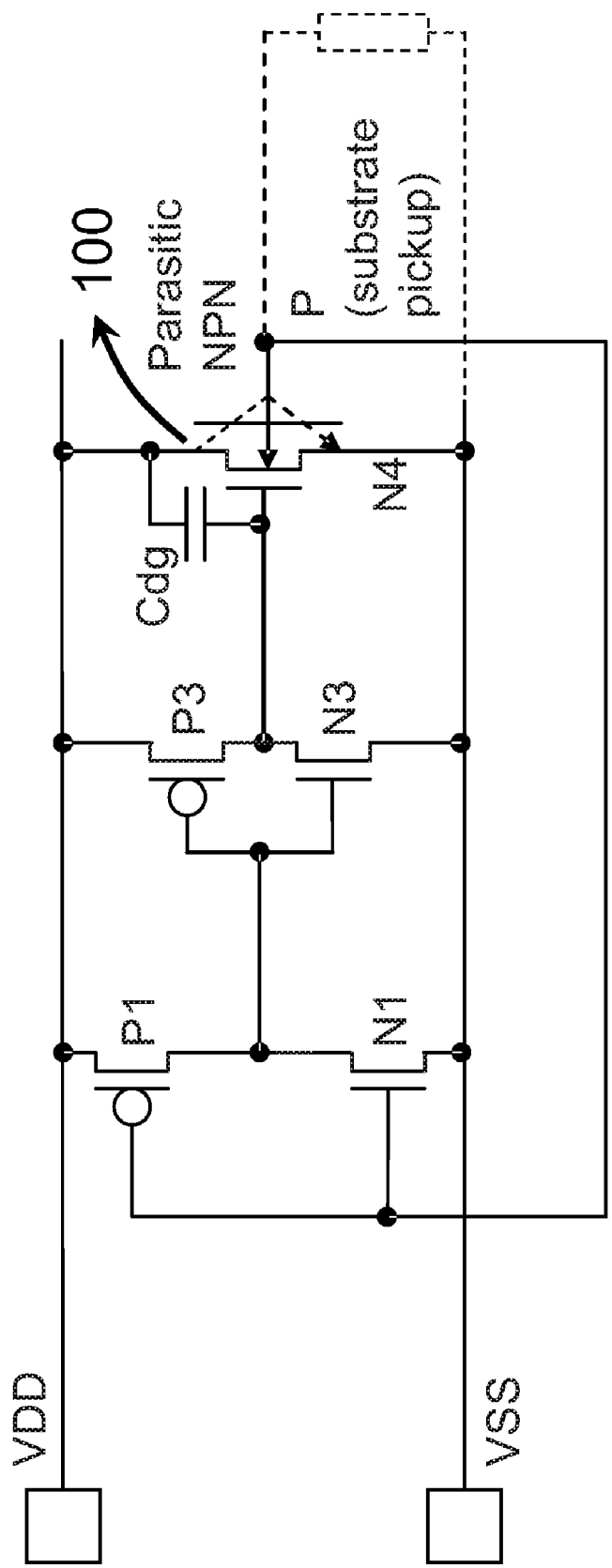
FIG. 8 illustrates an electro static discharge clamp devices, in accordance with an embodiment of the invention.

FIG. 8 illustrates an embodiment of a circuit implementation of the invention using ABST techniques discussed in FIG. 2. In various embodiments, the capacitance required for the triggering the ABST clamp is small due to the dependence on the RC circuit only for the initial triggering. This is in contrast to the RCMOS devices that require large capacitors. Hence, in some embodiments, the intrinsic capacitance of the MOS transistor 100 is used as the initial triggering capacitor. During normal operating conditions, the third NMOS transistor N3 is "on" acting as a resistor, similar to the resistor 10 of the RC timer circuit.

Referring to FIG. 8, the drain-gate capacitance (Cdg) of the MOS transistor 100 is used similar to the RC timer circuit. The drain-gate capacitance (Cdg) arises primarily due to the overlap of the drain extension regions under the gate electrode of the MOS transistor 100. In various embodiments, the MOS transistor 100 can be designed to vary this intrinsic capacitance also called Miller capacitance. Consequently using the embodiment, the external RC circuit is eliminated.

Figure 9:
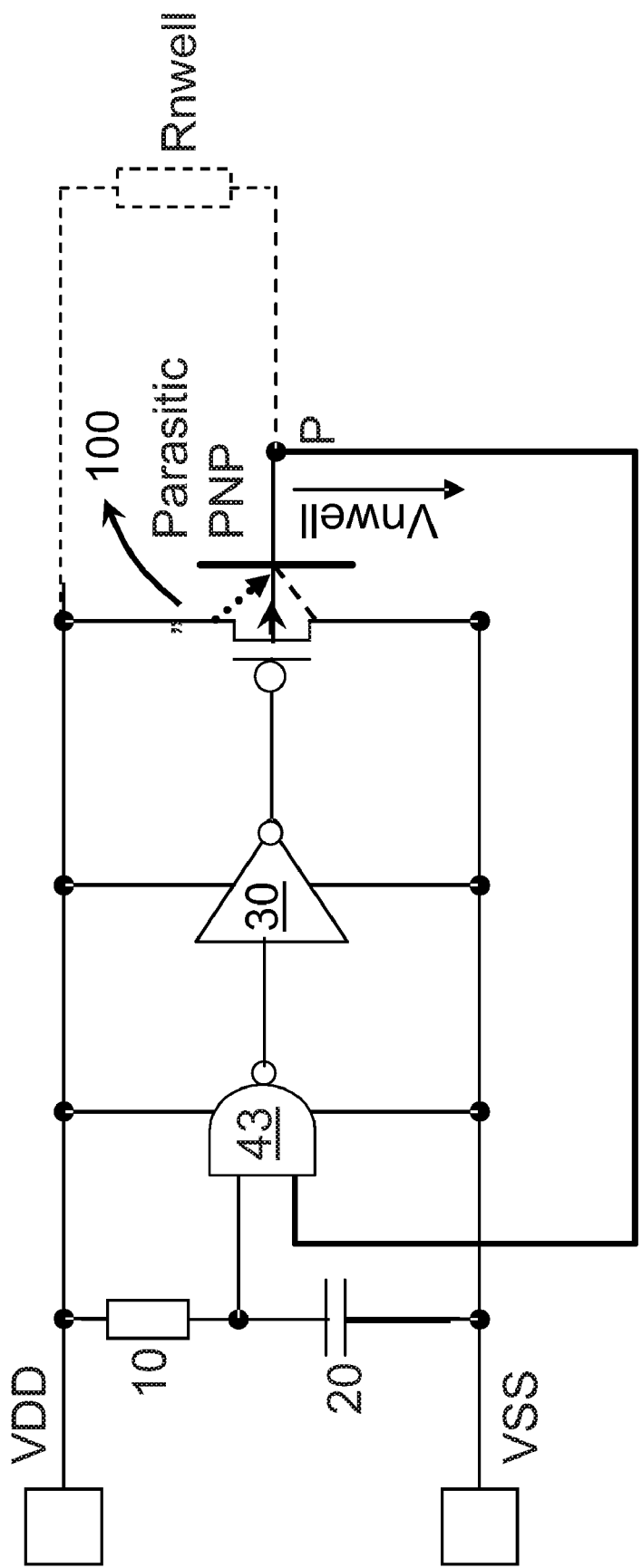
FIG. 9 illustrates an electro static discharge clamp device, wherein the MOS transistor comprises a PMOS transistor, in accordance with an embodiment of the invention.

FIG. 9 illustrates an embodiment of the ABST clamp device using a PMOS transistor as the clamping transistor. Although the embodiments of FIGS. 5-8 are described using a NMOS transistor as the MOS clamp transistor, other embodiments may use PMOS transistors.

Referring to FIG. 9, the placement of the resistor 10 and the capacitor 20 is exchanged relative to FIG. 2a. Further, the NOR gate 40 in FIG. 2a is replaced by a NAND gate 43. The substrate resistance Rsub to the substrate voltage line VSS is replaced with the nwell resistance Rnwell to the power supply line VDD. Thus, the NAND gate 43 is coupled to the inverting buffers 30 forming an AND logic block.

In particular, a first plate of the capacitor 20 is coupled to the power supply line VDD through a resistor 10 and a second plate of the capacitor 20 is coupled to the substrate voltage line VSS. The first input of the NAND gate 43 is coupled to the first plate of the capacitor 20, while a second input of the NAND gate 43 is coupled to the local substrate (nwell) of the MOS transistor 100 through a pickup node P. The coupling of the local nwell potential of the MOS transistor 100 to the second input of the NAND gate 43 forms the auto biasing circuit.

Figure 10A:
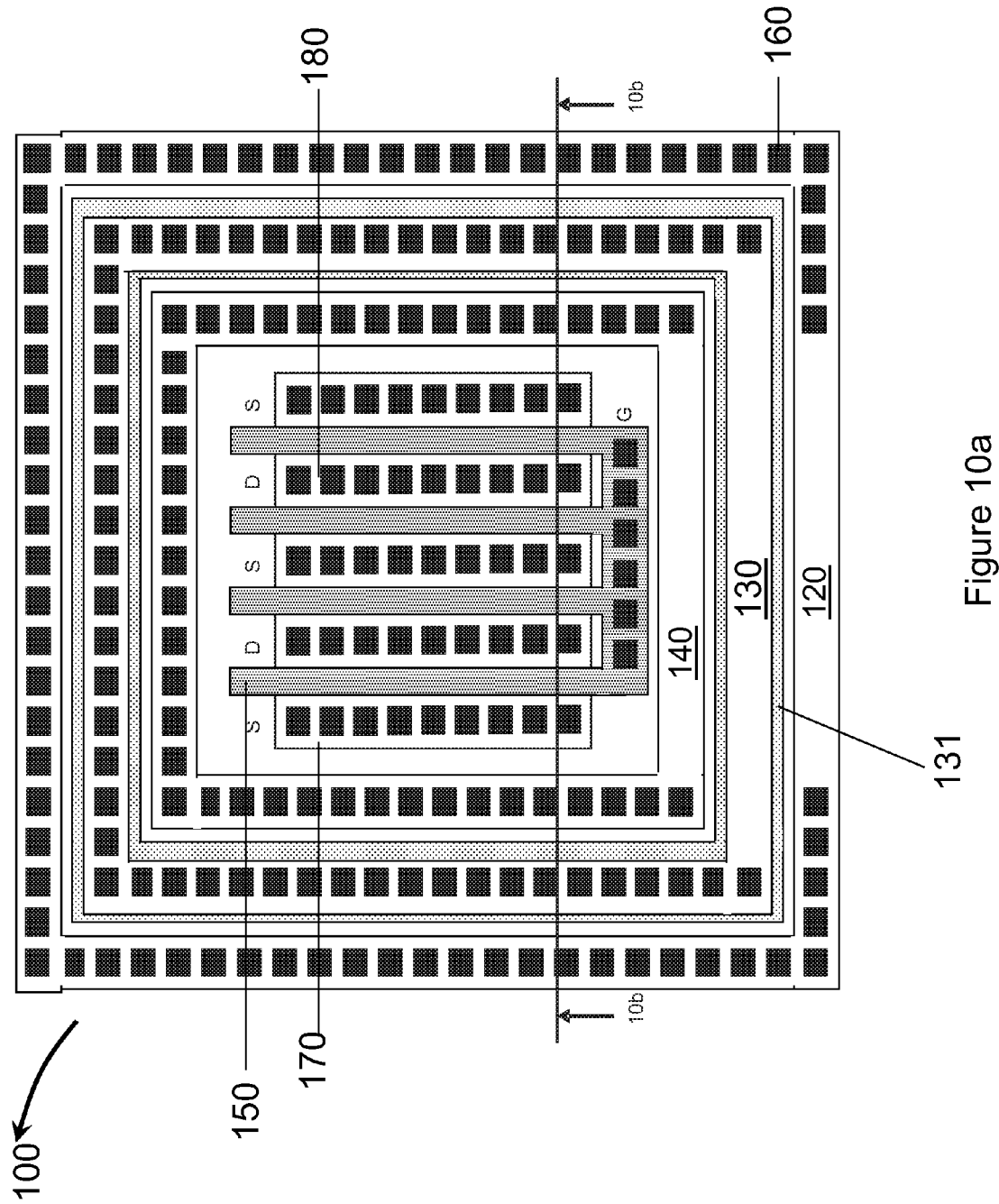
Figure 10B:
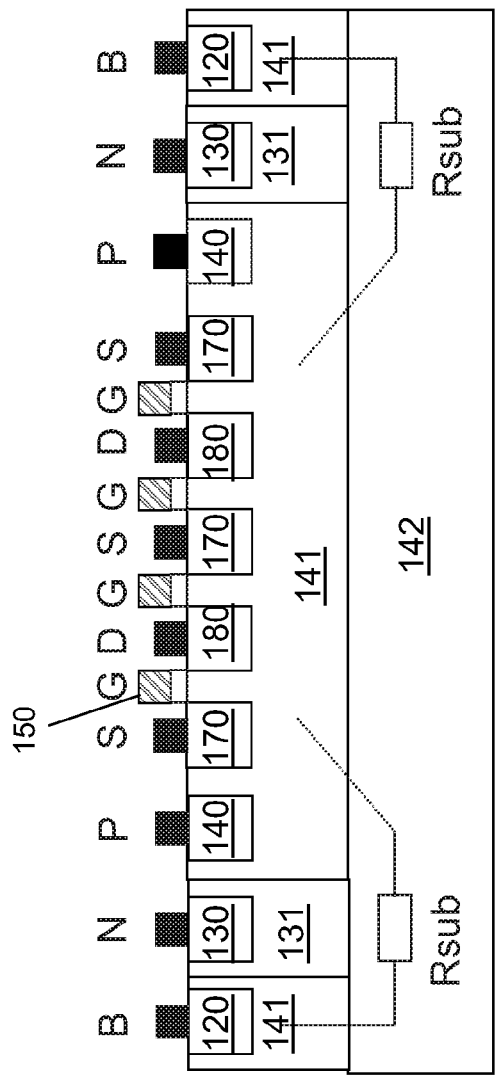
Figure 10C:
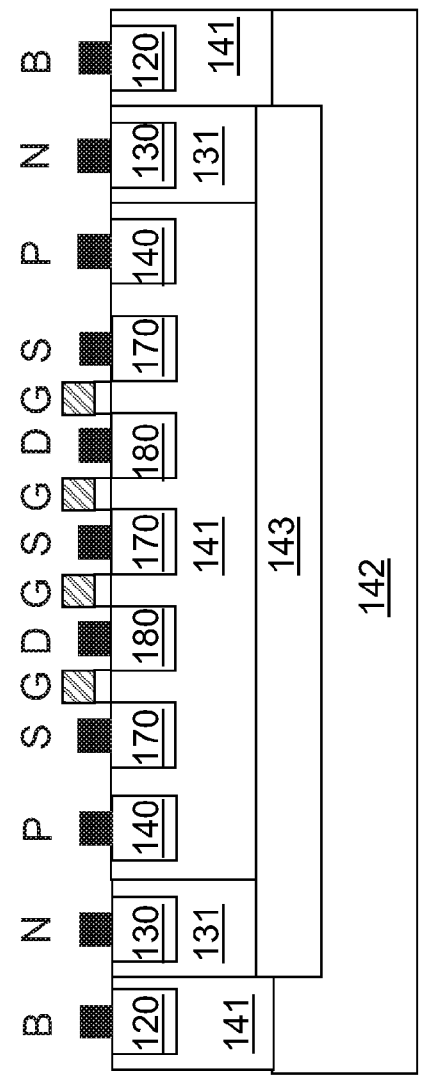
Figure 11:
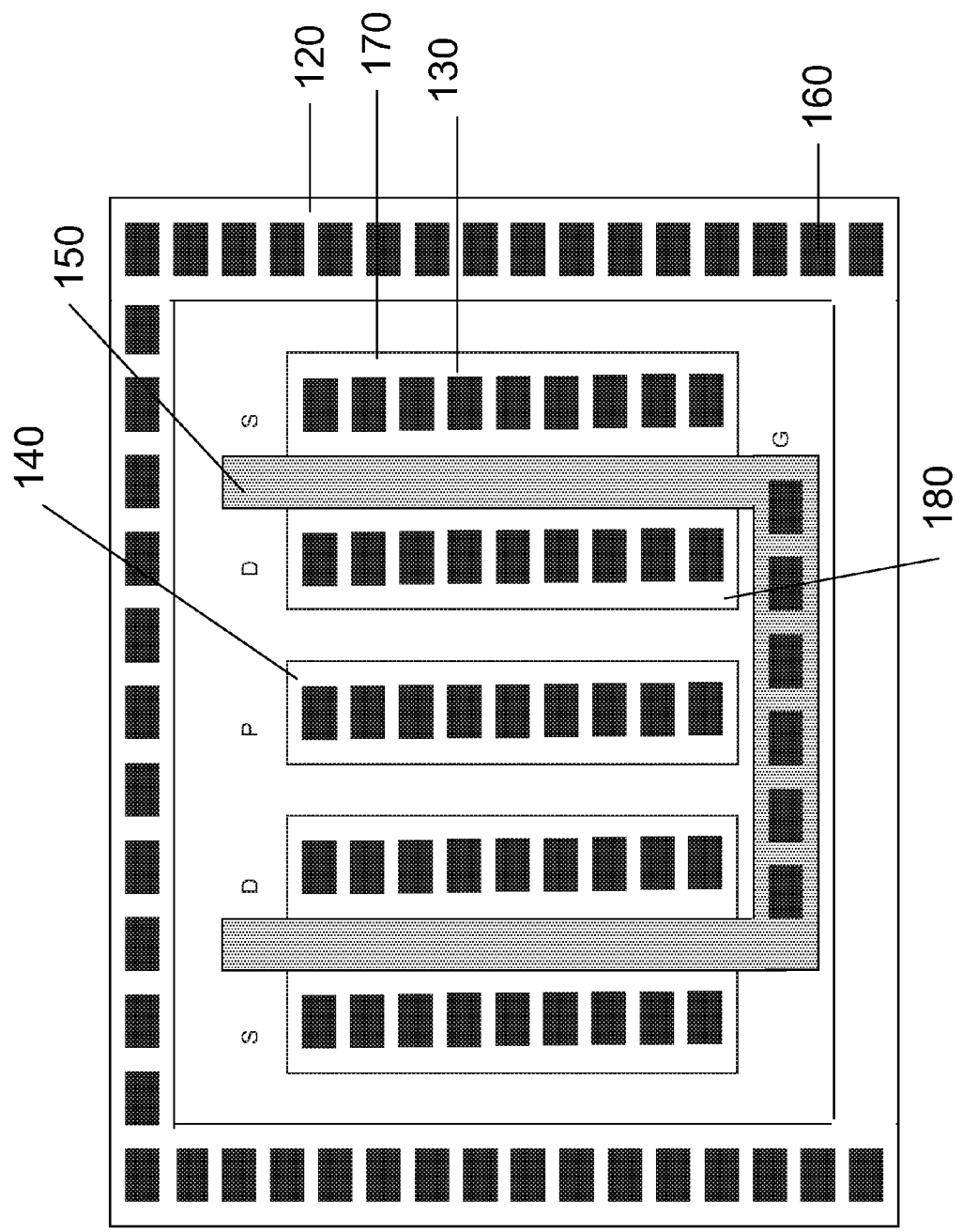
FIG. 11 illustrates the layout of the MOS transistor of the electro static discharge clamp devices, in accordance with an embodiment of the invention.

FIGS. 10 and 11 describe the layout of the MOS transistor used in various embodiments described in FIGS. 2-9. FIG. 10, which includes 10a-10c, illustrates the layout of MOS transistor in accordance with an embodiment of the invention.

FIG. 10a illustrates a top view of an embodiment of the MOS transistor 100 as described in, for example, FIG. 2. FIGS. 10b and 10c illustrate cross sectional views of FIG. 10a according to alternate embodiments of the invention.

Referring to FIG. 10a, the MOS transistor 100 (a NMOS transistor as an example) comprises a first ring 120 (for example, a p type region) coupled to a standard substrate potential node. A second ring 130 comprising an n type region is disposed around the first ring 120. In various embodiments, the second ring 130 is floating or coupled to a reference potential. A gate 150 (for example, U shaped gate) is disposed centrally forming the MOS transistor 100. The various regions are contacted using contacts 160. Further, source (S), and drain (D) regions of the MOS transistor 100 are illustrated in the top view. In various embodiments, the number or transistor fingers can vary, and in one embodiment determined by the targeted ESD hardness of the clamp device.

The MOS transistor 100 additionally comprises a pickup region 140 (a third ring) disposed between the gate 150 and the second ring 130 (n-well). In various embodiments, the pickup region 140 comprises any suitable shape. The pickup region 140 (e.g. a p type doped region in the shape of a ring) is coupled to the substrate and comprises contacts that form the substrate pickup nodes. In various embodiments, the pickup region 140 comprises a p+ region for efficient pick up of the substrate potential without resistive losses. The pick up region 140 is shielded from the first ring 120 by the second ring 130 because the second ring is floating or coupled to a fixed potential node (for example, drain voltage Vdd).

The cross section views of FIG. 10a are illustrated in FIGS. 10b and 10c which illustrate alternate embodiments. FIG. 10b illustrates a dual well process, whereas FIG. 10c illustrates a triple well process. Embodiments of the invention described above may include any of the cross sections illustrated in FIGS. 10b and 10c.

The MOS transistor 100 comprises source regions 170 and drain regions 180 separated by channel regions disposed in a first well region 141 (p well region for a NMOS). The first well region 141 is disposed on a lower doped substrate 142. For example, in one embodiment, the lower doped substrate 142 comprises a deep well region formed in a substrate, in other embodiments the lower doped substrate 142 comprises the doping of the substrate before fabrication, for example, a p type doped wafer in one embodiment. The first well region 141 is formed within the lower doped substrate 142. The first well region 141 comprises a same type of doping, in one embodiment.

A first ring 120 comprising a heavily doped region ($p^+$ doping for a NMOS) is disposed on the first well region 141 as illustrated in FIG. 10a. A ring shaped second well region 131 is disposed under the second ring 130 (see FIG. 10a). The second well region 131 is disposed adjacent the first well region 141 and separates the first well region 141 into a first portion and a second portion. The second well region 131 comprises an $n^-$ doping for a NMOS transistor. A second ring 130 is disposed in the second well region 131. A pickup region 140 comprising a heavily doped region ($p^+$ doping for a NMOS) is disposed on the first well region 141 as illustrated in FIG. 10a. The second ring 130 is thus disposed between the first ring 120 and the pickup region 140. The second ring 130 shields the first ring 120 from the active part of the substrate (e.g., the source/substrate junction of the MOS transistor 100). Thus, the second ring 130 enables the pickup region 140 to tap into the substrate potential more efficiently.

In the dual well process illustrated in FIG. 10b, the substrate of the MOS transistor 100 is coupled to the body or substrate contact (first ring 120) through a lower doped region and hence through an effective substrate resistance Rsub. This coupling of the substrate to the substrate potential line VSS is also depicted in various embodiments in above Figures (e.g. FIGS. 4-8 illustrate this embodiment as effective substrate resistance Rsub). In various embodiments, the first well region 141 is about 0.5 µm to about 5 µm deep, and about 2 µm in one embodiment.

In contrast, in the triple well design (FIG. 10c) a second well region 143 is formed disposed within the lower doped substrate 142. The second well region 143 is deeper than the first well region 141 and comprises an opposite type doping. Hence, the triple well design creates an isolated portion of the first well region 141. The isolated first well region 141 is shielded from the substrate contact (first ring 120) by second ring 130 laterally and vertically by the second well region 143. Hence, this results in optimal pickup of the potential under the active MOS device.

FIG. 11 illustrates an alternate embodiment of the top view of MOS transistor described with respect to FIG. 10a. Unlike FIG. 10a, the pickup region 140 is placed centrally while the gate 150 is disposed between source regions 170 and drain regions 180 on either side of the device. As the pickup region 140 is placed centrally additional shielding rings (example, second ring of FIG. 10a) are not necessary resulting in area savings. Although this layout is more efficient, a decrease in efficiency of pickup is likely. In some embodiments, a lower efficiency of the potential pickup may be acceptable for the gains in area.

In various embodiments, the ESD clamp device described above comprises a device with a low capacitance unlike the RCMOS clamp illustrated for example in FIG. 1a. Hence, in various embodiments, the ESD clamp device is used for protection of local input/output (I/O) pads. In various embodiments, the ABST clamp described above is applied to CMOS bulk, SOI technologies with substrate or body contacts as well as bipolar and/or mixed signal technologies.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a first transistor, the first transistor comprising a first source/drain and a second source/drain, the first source/drain coupled to a first potential node, the second source/drain coupled to a second potential node;
    an OR logic block;
    a first input of the OR logic block coupled to the first potential node through a capacitor, the first input of the OR logic block being coupled to the second potential node through a resistor; and
    a second input of the OR logic block coupled to a substrate pickup node of the first transistor.

2. The device of claim 1, wherein the OR logic block comprises an OR gate.

3. The device of claim 1, wherein the OR logic block comprises a NOR gate coupled to a first inverting buffer, wherein the first input of the OR logic block is a first input of the NOR gate, and wherein the second input of the OR logic block is a second input of the NOR gate, and wherein an output of the NOR gate is coupled to an input of the first inverting buffer.

4. The device of claim 3, wherein the NOR gate comprises a first PMOS transistor, a second PMOS transistor, a first NMOS transistor, a second NMOS transistor, wherein a first source/drain of the first PMOS transistor is coupled to the first potential node, wherein a second source/drain of the first PMOS transistor is coupled to the first source/drain of the second PMOS transistor, and wherein a second source/drain of the second PMOS transistor is coupled to a first source/drain of the first NMOS transistor, wherein a second source/drain of the first NMOS transistor is coupled to the second potential node, wherein a first source/drain of the second NMOS transistor is coupled to the second source/drain of the PMOS transistor, wherein a second source/drain of the second NMOS transistor is coupled to the second potential node.

5. The device of claim 4, wherein the first input of the NOR gate is coupled to a gate of the first PMOS and NMOS transistors, and wherein the second input of the NOR gate is coupled to the gate of the second PMOS and NMOS transistors.

6. The device of claim 4, wherein the second source/drain of the second PMOS transistor, and the first source/drain of the first and the second NMOS transistors are coupled to the output node of the NOR gate.

7. The device of claim 3, wherein the first inverting buffer comprises a CMOS inverter, the input of the CMOS inverter being coupled to the output of the NOR gate, the output of the CMOS inverter being coupled to a gate of the first transistor.

8. The device of claim 1, wherein the first potential node comprises a power supply node, and wherein the second potential node comprises a ground potential node.

9. The device of claim 1, wherein an output of the OR logic block is coupled to a gate of the first transistor.

10. The device of claim 9 further comprising an even number of additional inverting buffers disposed in series between the output of the OR logic block and the gate of the first transistor, wherein the output of the OR logic block is coupled to the gate of the first transistor through the additional inverting buffers.

11. The device of claim 3, wherein an output of the first inverting buffer is coupled to a gate of the first transistor.

12. The device of claim 11 further comprising a second inverting buffer and a third inverting buffer coupled between the output of the first inverting buffer and the gate of the first transistor, wherein the output of the first inverting buffer is coupled to an input of the second inverting buffer, wherein an output of the second inverting buffer is coupled to an input of the third inverting buffer, and wherein an output of the third inverting buffer is coupled to the gate of the first transistor.

13. The device of claim 1, wherein the first transistor comprises a NMOS transistor, wherein the first potential node comprises a power supply node, and wherein the second potential node comprises a ground potential node.

14. The device of claim 1, wherein the first transistor comprises:
a first well region disposed in a substrate, the first well region comprising a first doping type, the first source/drain of the first transistor disposed in the first well region, the second source/drain of the first transistor disposed in the first well region, the first and the second source/drain comprising a second doping type, the second doping type being opposite to the first doping type;
a first gate electrode disposed above the substrate, the first gate electrode disposed between the first source/drain of the first transistor and the second source/drain of the first transistor; and
a pickup region disposed in the first well region, the pickup region comprising the first doping type, the substrate pickup node of the first transistor disposed on the pickup region; and
a substrate contact region disposed in the first well region, the substrate contact region comprising the first doping type, the substrate contact region being coupled to the second potential node.

15. The device of claim 14, wherein the first well region comprises a $p^-$ doping, wherein the first and the second source/drains of the first transistor comprise an $n^+$ doping, wherein the pickup region and the substrate contact region comprise a $p^+$ doping.

16. The device of claim 14 further comprising a shielding region, the shielding region disposed between the substrate contact region and the first source/drain of the first transistor, wherein the shielding region is disposed between the pickup region and the substrate contact region.

17. The device of claim 16, wherein the substrate contact region forms an outer ring, wherein the shielding region forms a middle ring, and wherein the pickup region forms an inner ring.

18. The device of claim 14, wherein the substrate contact region forms an outer ring, wherein the outer ring comprises a symmetrically located central axis, wherein the pickup region is disposed symmetrically along the central axis.

19. A semiconductor device comprising:
a MOS transistor, the MOS transistor comprising a first source/drain and a second source/drain, the first source/drain coupled to a first potential node, the second source/drain coupled to a second potential node;
an input of a first inverting buffer coupled to a substrate pickup node of the first transistor;
an input of a second inverting buffer coupled to an output of the first inverting buffer; and
a gate of the MOS transistor coupled to a output of the second inverting buffer.

20. The device of claim 19, wherein the input of the first inverting buffer coupled to the first potential node through a capacitor, and wherein the input of the first inverting buffer is coupled to the second potential node through a resistor.

21. The device of claim 19, wherein the first inverting buffer comprises a first PMOS transistor and a first NMOS transistor, a first source/drain of the first PMOS transistor is coupled to the first potential node, a second source/drain of the first PMOS transistor is coupled to a first source/drain of the first NMOS transistor, and wherein a second source/drain of the first NMOS transistor is coupled to the second potential node.

22. The device of claim 21, wherein gates of the first PMOS and NMOS transistors are coupled to the input node of the first inverting buffer, and wherein the second source/drain of the first PMOS transistor and the first source/drain of the first NMOS transistor are coupled to the output of the first inverting buffer.

23. The device of claim 22, wherein the second inverting buffer comprises a second PMOS transistor and a second NMOS transistor, a first source/drain of the second PMOS transistor is coupled to the first potential node, a second source/drain of the second PMOS transistor is coupled to a first source/drain of the second NMOS transistor, and wherein a second source/drain of the second NMOS transistor is coupled to the second potential node.

24. The device of claim 23, wherein gates of the second PMOS and NMOS transistors are coupled to the output node of the second inverting buffer, and wherein the second source/drain of the second PMOS transistor and the first source/drain of the second NMOS transistor are coupled to the output of the second inverting buffer.

25. The device of claim 19, wherein the gate of the MOS transistor and the first source/drain of the MOS transistor are coupled through an internal capacitor.

26. The device of claim 19, wherein the first potential node comprises a power supply node, and wherein the second potential node comprises a ground potential node.

27. A semiconductor device comprising:
a MOS transistor, the MOS transistor comprising a first source/drain and a second source/drain, the first source/drain coupled to a first potential node, the second source/drain coupled to a second potential node;

a first PMOS transistor, wherein a first source/drain of the first PMOS transistor is coupled to the first potential node;

a second PMOS transistor, wherein a second source/drain of the first PMOS transistor is coupled to a first source/drain of the second PMOS transistor;

a first NMOS transistor, wherein a second source/drain of the second PMOS transistor is coupled to a first source/drain of the first NMOS transistor, wherein a second source/drain of the first NMOS transistor is coupled to the second potential node, wherein a gate of the first PMOS transistor and a gate of the first NMOS transistor are coupled to the first potential node through a capacitor;

a second NMOS transistor, wherein a first source/drain of the second NMOS transistor is coupled to the second source/drain of the PMOS transistor, wherein a second source/drain of the second NMOS transistor is coupled to the second potential node, wherein a gate of the second PMOS transistor and a gate of the second NMOS transistor are coupled to a substrate pickup node of the MOS transistor;

a third PMOS transistor, wherein a first source/drain of the third PMOS transistor is coupled to the first potential node; and a third NMOS transistor, wherein a first source/drain of the third NMOS transistor is coupled to a second source/drain of the third PMOS transistor, wherein a second source/drain of the third NMOS transistor is coupled to the second potential node, wherein gates of the third PMOS and NMOS transistors are coupled to the second source/drain of the second PMOS transistor, and wherein the second source/drain of the third PMOS transistor is coupled to the gate of the MOS transistor.

28. The device of claim 27, wherein the gate of the first PMOS transistor and the gate of the first NMOS transistor are coupled to the second potential node through a resistor.

29. The device of claim 27, wherein a substrate contact of the MOS transistor is coupled to the second potential node through a substrate resistor.

30. A semiconductor device comprising:

a MOS transistor, the MOS transistor comprising a first source/drain and a second source/drain, the first source/drain coupled to a first potential node, the second source/drain coupled to a second potential node;

a AND logic block;

a first input of the AND logic block coupled to the first potential node through a resistor, the first input of the AND logic block being coupled to the second potential node through a capacitor; and a second input of the AND logic block coupled to a substrate pickup node of the MOS transistor.

31. The device of claim 30, wherein the AND logic block comprises an AND gate.

32. The device of claim 30, wherein the AND logic block comprises a NAND gate coupled to a first inverting buffer, wherein the first input of the AND logic block is a first input of the NAND gate, and wherein the second input of the AND logic block is a second input of the NAND gate, wherein an output of the NAND gate is coupled to an input of the first inverting buffer, and wherein an output of the first inverting buffer is coupled to the output of the AND logic block.

33. The device of claim 30, wherein the MOS transistor comprises a PMOS transistor, wherein the first potential node comprises a power supply node, and wherein the second potential node comprises a ground potential node.

34. The device of claim 30, wherein an output of the AND logic block is coupled to a gate of the MOS transistor.

* * * * *